(12) United States Patent
Shih et al.

(10) Patent No.: US 6,319,861 B1
(45) Date of Patent: Nov. 20, 2001

(54) METHOD OF IMPROVING DEPOSITION

(75) Inventors: Hsueh-Hao Shih, Hsinchu; Alan Cheng, Kaohsiung; Juan-Yuan Wu, Hsinchu, all of (TW)

(73) Assignee: United Microelectronics Corp., Hisnchu (TW)

( * ) Notice: Subject to any disclaimer, the term of this patent is extended or adjusted under 35 U.S.C. 154(b) by 0 days.

(21) Appl. No.: 09/562,529

(22) Filed: May 2, 2000

(51) Int. Cl.[7] .................................................... H01L 21/31

(52) U.S. Cl. ........................... 438/798; 438/695; 438/706; 438/723; 438/734; 438/743; 438/745; 438/748; 438/753; 438/756

(58) Field of Search ..................................... 438/695, 706, 438/723, 734, 743, 745, 748, 753, 754, 756, 798

(56) References Cited

U.S. PATENT DOCUMENTS

| | | | | |
|---|---|---|---|---|
| 6,008,128 | * | 6/1998 | Habuka et al. ....................... | 438/695 |
| 6,027,970 | * | 2/2000 | Sharan et al. ........................ | 438/255 |
| 6,048,782 | * | 4/2000 | Moslehi ................................ | 438/565 |
| 6,090,721 | * | 6/1999 | Yates .................................... | 438/745 |
| 6,159,859 | * | 6/1998 | Robertson, III et al. ............ | 438/706 |

* cited by examiner

Primary Examiner—David Nelms
Assistant Examiner—Renee R. Berry
(74) Attorney, Agent, or Firm—Jiawei Huang; J. C. Patents

(57) ABSTRACT

A method for improving the quality of a deposited layer over a silicon substrate in a selective deposition where the silicon substrate has a native oxide layer thereon. A plasma reaction using a halogen compound as a reactive agent is performed so that the native oxide layer is transformed into a silicon halide layer and then removed at low pressure. A layer of the desired material is formed over the native oxide free silicon substrate surface by selective deposition.

16 Claims, No Drawings

METHOD OF IMPROVING DEPOSITION

BACKGROUND OF THE INVENTION

1. Field of the Invention

The present invention relates to a process in the manufacturing of semiconductors. More particularly, the present invention relates to a treatment process capable of improving the quality of a deposited layer in a selective deposition.

2. Description of Related Art

In the manufacturing of semiconductors, selective deposition is often used to form different material layers, each having a desired thickness so that time-consuming and costly lithographic operations can be eliminated. For example, in the fabrication of the source/drain region of a MOS device having a shallow junction design, selective deposition deposits a silicon (or germanium) layer above the source/drain region to form a raised source/drain terminal. The raised source drain terminal is capable of preventing a junction leakage that results from the removal of a portion of the silicon material from the shallow junction layer above the source/drain region in a subsequent metal silicide reaction.

However, due to atmospheric oxidation, a native oxide layer having a non-uniform thickness but averaging at about 20 Å is generally formed over the surface of a silicon layer. Hence, when a material is deposited over the silicon layer by selective deposition, dislocation, stack faults, uneven distribution and insufficient selectivity of the deposited material layer often occur. In brief, native oxide is a major drawback for selective deposition of material layers.

The conventional method of removing the effect due to the presence of a native oxide layer includes implanting boron difluoride ions $BF_2^+$ into the silicon substrate before carrying out the selective deposition of silicon (germanium) over the source/drain region. However, since an ion implantation may change the electrical properties of the substrate, the treatment can be applied to prime either a NMOS or a PMOS transistor, but not both. Furthermore, ion implantation and the selective deposition of silicon (germanium) cannot be carried out in the same reaction chamber, thereby adding some complications to the processing method.

SUMMARY OF THE INVENTION

Accordingly, one object of the present invention is to provide a process treatment for removing a native oxide layer from the surface of a silicon substrate in order to improve the quality of the subsequently deposited layer in a selective deposition.

To achieve these and other advantages and in accordance with the purpose of the invention, as embodied and broadly described herein, the invention provides a treatment process for removing native oxide from the surface of a silicon substrate. First, a plasma reaction of the substrate is carried out using a halogen compound as a gaseous reactant so that the native oxide layer is transformed into a silicon halide layer. The silicon halide layer is next removed at a low pressure. Finally, a layer of the desired material is deposited over the silicon substrate in a selective deposition. Since the kinetic energy of the plasma in the plasma reaction can be accurately controlled, damage to the silicon substrate under the native oxide layer is limited.

The desired material layer is deposited over the silicon substrate after the native oxide layer is removed. Hence, the material is formed on a structurally uniform silicon surface so that such defects as dislocation, stack faults, uneven distribution of the deposited layer and insufficient selectivity of the deposition are absent.

In addition, any other processes that demand a clean and smooth silicon surface may apply the method suggested in this invention to remove the native oxide layer. For example, the method can be applied to remove surface native oxide from a silicon substrate before carrying out thermal reactions to form an oxide layer, or, a silicide reaction to form a metal silicide layer.

It is to be understood that both the foregoing general description and the following detailed description are exemplary, and are intended to provide further explanation of the invention as claimed.

DESCRIPTION OF THE PREFERRED EMBODIMENTS

In the embodiment of this invention, the selective deposition of silicon (germanium) material over a source/drain region is chosen as an example. The process is explained in more detail below. First, the silicon substrate is placed inside a reaction chamber. The silicon substrate includes a source/drain region that has a native oxide layer thereon.

A halogen compound is passed into the reaction chamber serving as a reactive gas in a plasma reaction of the silicon substrate. For example, the halogen compound can be a fluoride or a chloride. The fluoride includes such compounds as ammonium fluoride ($NF_3$), carbon tetrachloride ($CF_4$) and silicon hexafluoride ($SiF_6$). The chloride includes such compounds as hydrogen chloride (HCl), carbon tetrachloride ($CCl_4$) and silicon tetrachloride ($SiCl_4$). In addition, the flow rate of the halogen compound should preferably be between 1 liter/minute to 10 liter/minute. The plasma reaction is preferably carried out at a temperature of about 200° C. to 900° C.

In the plasma reaction, many activated substances are produced from the fluoride (chloride) compound including fluorine (chlorine) atoms. These fluorine (chlorine) atoms react with the native oxide so that the native oxide layer is transformed into a volatile silicon fluoride (chloride) layer. At a low reaction chamber pressure, this silicon fluoride (chloride) layer is removed retaining only an evenly distributed silicon-fluoride (-chloride) dangling bonds above the silicon substrate surface as shown below.

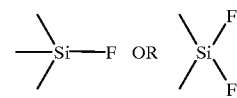

After the plasma reaction, silicon (germanium) is deposited over the source/drain region by selective deposition to form a raised source/drain terminal. During selective deposition, the silicon-fluoride (-chloride) dangling bonds break open so that the silicon (germanium) atoms join the silicon on the surface of the silicon substrate to form silicon-silicon bonds.

The preferred conditions for plasma reaction is explained in further detail below. First, kinetic energy of the plasma must be carefully controlled so that damage to the silicon layer immediately below the native oxide layer is prevented. Hence, the preferred plasma reaction is a remote plasma reaction. In other words, the place where the plasma should be generated outside the reaction chamber so that plasma will not contact the substrate surface directly and the effect of plasma kinetic energy on the substrate surface is minimal.

In addition, concentration of activated material inside the reaction chamber must be carefully controlled if chlorine is used as the halogen reactant because chlorine can erode a portion of the silicon layer underneath the native oxide layer.

Since the desired material layer is deposited over the silicon substrate after the native oxide layer is removed, the material is formed on a structurally uniform silicon surface. Hence, defects such as dislocation, stack faults, uneven distribution of the deposited layer and insufficient selectivity of the deposition are greatly reduced.

In addition, since the implantation of $BF_2^+$ ions into the silicon substrate is not required in this invention, the treatment method can be applied to remove native oxide layer over PMOS as well as NMOS transistors. Moreover, the plasma reaction and the subsequent selective deposition can be carried out in the same reaction chamber. Hence, compared with the conventional method of $BF_2^+$ ion implantation in an implant station followed by selective deposition in a deposition station, the processing treatment used in this invention is simplified.

Furthermore, any other processes that demand a clean and smooth silicon surface may apply the method suggested in this invention to remove the native oxide layer. For example, the method can be applied to remove surface native oxide from a silicon substrate before carrying out thermal reactions to form an oxide layer, or, a silicide reaction to form a metal silicide layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for improving the quality of a deposited layer over a silicon substrate in a selective deposition, where the silicon substrate has a native oxide layer thereon, comprising:

performing a plasma reaction at a temperature higher than 200° C. using a halogen compound as a reactive agent so that the native oxide layer is transformed into a silicon halide to be removed under a low pressure, wherein the kinetic energy of the plasma in the plasma reaction is controlled so that any damage to the silicon layer underneath the native oxide layer is preserved; and forming a desired material layer over the native oxide free silicon substrate surface by selective deposition.

2. The method of claim 1, wherein the plasma reaction includes a remote plasma reaction.

3. The method of claim 1, wherein the silicon substrate surface for selective deposition includes the surface of a source/drain region and the material of the deposited layer includes silicon or germanium.

4. The method of claim 1, wherein the halogen compound includes a fluoride.

5. The method of claim 4, wherein the fluoride includes hydrogen fluoride (HF), carbon tetrafluoride ($CF_4$) or silicon hexafluoride ($SiF_6$).

6. The method of claim 1, wherein the halogen compound includes a chloride.

7. The method of claim 6, wherein the chloride includes hydrogen chloride (HCl), carbon tetrachloride ($CCl_4$) or silicon tetrachloride ($SiCl_4$).

8. The method of claim 6, wherein concentration of the activated chloride compound in the plasma reaction can be controlled so that the activated chloride is prevented from eroding the surface of the silicon substrate.

9. The method of claim 1, wherein the halogen compound used in the plasma reaction has a flow rate of about 1 liter/minute to 10 liters/minute.

10. The method of claim 1, wherein the plasma reaction is carried out at a temperature of about 200° C. to 900° C.

11. A method for removing native oxide layer from a silicon substrate, comprising performing a plasma reaction at a temperature not lower than 200° C. using a halogen compound as a reactive agent so that the native oxide layer is converted into a silicon halide and then removed at low pressure, wherein the plasma reaction is a remote reaction.

12. The method of claim 11, wherein the kinetic energy of the plasma in the plasma reaction can be accurately controlled so that any damage to the silicon layer underneath the native oxide layer is prevented.

13. The method of claim 11, wherein the halogen compound includes a chloride and that the concentration of the activated chloride in the plasma reaction can be controlled to prevent the erosion of the silicon substrate.

14. The method of claim 11, wherein the halogen compound is selected from a group consisting of hydrogen fluoride (HF), carbon tetrafluoride ($CF_4$), silicon hexafluoride ($SiF_6$), hydrogen chloride (HCl), carbon tetrachloride ($CCl_4$) and silicon tetrachloride ($SiCl_4$).

15. The method of claim 11, wherein the halogen compound used in the plasma reaction has a flow rate of about 1 liter/minute to 10 liters/minute.

16. The method of claim 11, wherein the plasma reaction is carried out at a temperature of about 200° C. to 900° C.

* * * * *